(12) United States Patent
Matsuoka et al.

(10) Patent No.: US 6,483,140 B1
(45) Date of Patent: Nov. 19, 2002

(54) DRAM STORAGE NODE WITH INSULATING SIDEWALLS

(75) Inventors: Takeru Matsuoka, Tokyo (JP); Kazuhiro Tsukamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/481,387

(22) Filed: Jan. 12, 2000

(30) Foreign Application Priority Data

Jul. 26, 1999 (JP) .......................................... 11-211357

(51) Int. Cl.[7] .............................................. H01L 27/108
(52) U.S. Cl. ...................... 257/303; 257/296; 257/300; 438/238; 438/239; 438/386
(58) Field of Search ................................ 257/303, 300, 257/296; 438/238, 239, 250, 386, 393, 399

(56) References Cited

U.S. PATENT DOCUMENTS 5,453,952 A * 9/1995 Okudaira et al. ...... 365/189.01
5,732,009 A * 3/1998 Tadaki et al. .................. 365/51

FOREIGN PATENT DOCUMENTS

| JP | 04079366 A | * | 3/1992 | .................. 257/303 |
| JP | 9-82920 | | 3/1997 | |
| JP | 09082980 | | 3/1997 | |

* cited by examiner

*Primary Examiner*—Nathan J. Flynn
*Assistant Examiner*—Scott R Wilson
(74) *Attorney, Agent, or Firm*—McDermott, Will & Emery (57) ABSTRACT

A lower insulating film is formed so as to cover source/drain regions electrically connected to capacitors. Bit lines and upper insulating layers are formed on the lower insulating film. SCs opening to the lower insulating film are formed by an anisotropic etching process on process conditions for etching the upper insulating films at a high upper insulating film/lower insulating film selectivity. An insulating film of a quality equal to that of the lower insulating film is deposited so as to fill up the SCs and to cover the upper insulating film. The SCs is extended so as to open to the source/drain regions by an anisotropic etching process on process conditions for etching the lower insulating film at a high lower insulating film/silicon film selectivity.

3 Claims, 8 Drawing Sheets

*PRIOR ART*

Fig. 11

*PRIOR ART*

DRAM STORAGE NODE WITH INSULATING SIDEWALLS

BACKGROUND OF THE INVENTION

1. Field of the Invention

The present invention relates to a semiconductor device and a method of manufacturing the same, and more particularly, to a dynamic random-access memory of capacitor-over-bit-line construction and a method of manufacturing the same.

2. Description of the Background Art

Figure 9:
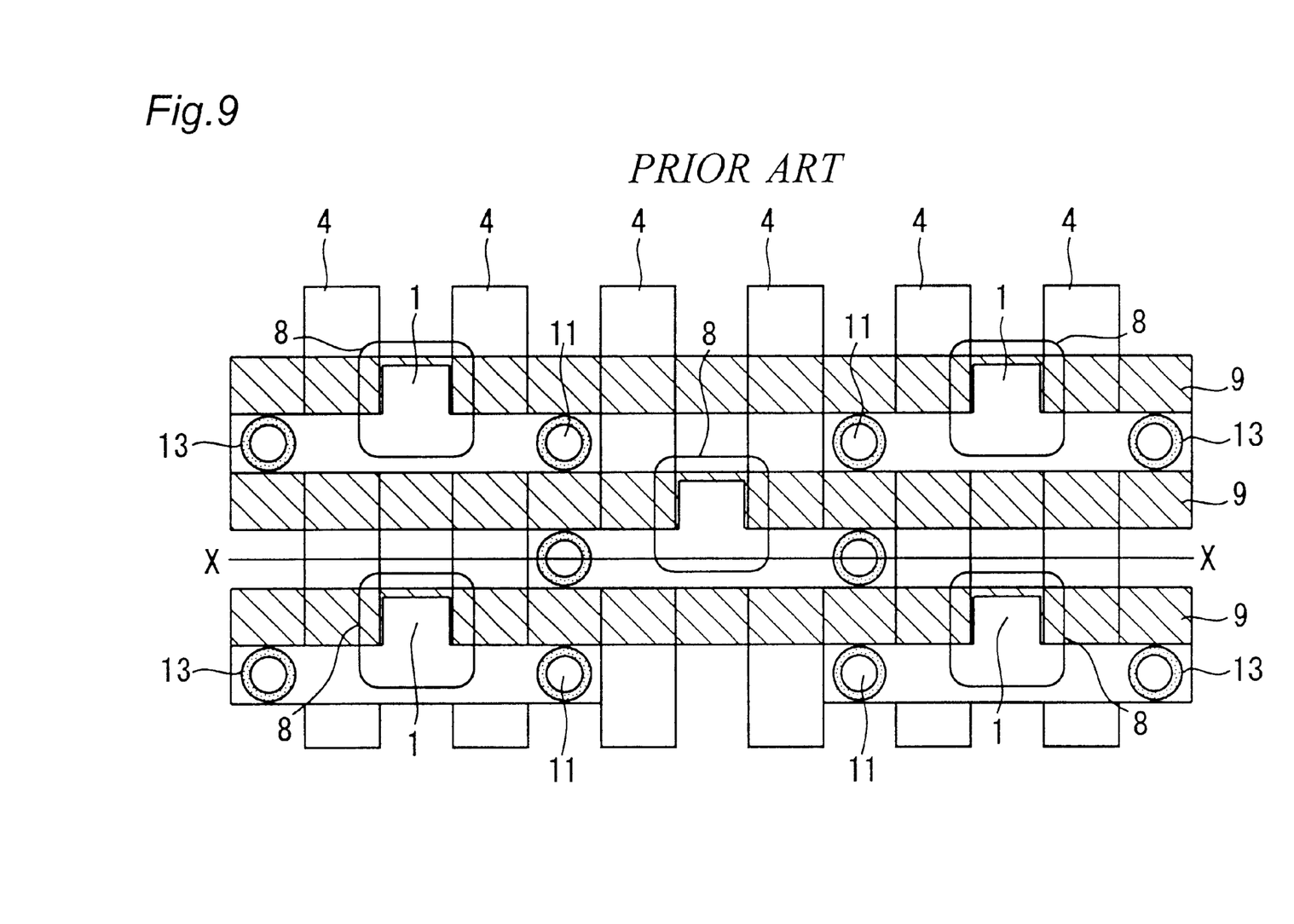
FIG. 9 is a plan view showing a DRAM of COB construction.
Figure 10:
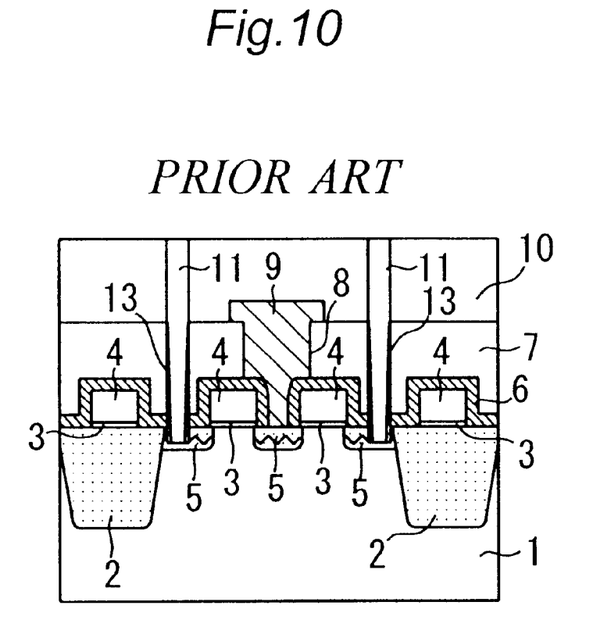
FIGS. 10 and 11 are sectional views for describing a manufacturing method of a conventional semiconductor.

The construction of a conventional dynamic random-access memory (DRAM) of capacitor-over-bit-line construction (COB) and a method of manufacturing the same will be described with reference to FIGS. 9 and 10. FIG. 9 is a plan view of a workpiece in one stage of a method of manufacturing the DRAM of capacitor-over-bit-line construction, and FIG. 10 is a sectional view taken on line X—X in FIG. 9.

The conventional DRAM has a silicon substrate 1. An isolating silicon oxide film 2 for isolating a plurality of active regions is formed on the silicon substrate 1. Channel regions covered with a gate silicon oxide film 3 and transfer gates (TGs) 4, and source/drain regions 5 adjacent to the channel regions are formed in the active regions.

A lower insulating film 6 of silicon nitride is formed over the silicon substrate 1 and the TGs 4. A first upper insulating film 7 is formed over the lower insulating film 6. Contact holes 8 opening into the source/drain regions 5 are formed in the first upper insulating film 7 by a known self-alignment process. Bit lines (BLs) 9 are formed on the first upper insulating film 7 so as to be connected through the contact holes 8 to the source/drain regions 5.

A second upper insulating film 10 is formed over the first upper insulating film 7 and the BLs 9. Storage node contacts (SCs) 11 are formed through the first upper insulating film 7 and the second upper insulating film 10 so as to open to the source/drain regions 5. As shown in FIG. 9, the SCs 11 are arranged between the TGs 4 and the BLs 9.

Capacitors, not shown, are formed on the second upper insulating film 10 so as to be electrically connected through the SCs 11 to the source/drain regions 5. Side walls 13 are formed on at least lower end portions of the SCs 11 to prevent short circuit between the capacitors and the TGs 4 or the BLs 9.

When manufacturing the conventional DRAM, the contact holes 8 for the BLs 9 are formed by a self-alignment method. The self-alignment method etches the first upper insulating film 7 (silicon oxide film) by an etching process using the lower insulating film 6 (silicon nitride film) as a stopper film on process conditions for etching the first upper insulating film 7 at a high selectivity relative to the lower insulating film 6. Subsequently, the lower insulating film 6 is removed by anisotropic etching to form the contact holes 8 opening to the source/drain regions 5. Thus, the contact holes 8 can be formed in self-alignment with the source/drain regions 5 so as to open to the source/drain regions 5 regardless of the accuracy of a photolithography process.

When manufacturing the conventional DRAM, the SCs 11 are formed through the second upper insulating film 10, the first upper insulating film 7 and the lower insulating film 6 (hereinafter referred to inclusively as "layer insulating films 6, 7 and 10") by anisotropic etching. The side walls 13 are formed by depositing an insulating film over the surface of the silicon substrate 1 and in the SCs 11, and etching portions of the insulating film deposited in the SCs 11 by anisotropic etching so that the source/drain regions 5 formed in the silicon substrate 1 are exposed.

The SCs 11, similarly to the contact holes 8 for the BLs 9, are through holes penetrating the silicon oxide films (the first upper insulating layer 7 and the second upper insulating layer 10) and the silicon nitride film (the lower insulating film 6). Therefore, the SCs 11 can be formed by a self-alignment method. However, in the DRAM of COB construction, the aspect ratio of the SCs 11 is large as compared with that of the contact holes 8.

The greater the aspect ratio of holes to be formed, the more difficult is the control of selectivity. If an etching process for forming the SCs 11 is performed under the conditions identical to those employed for opening the contact halls 8, i.e. the conditions that enable the removal of a silicon oxide film at a high selectivity, a state may occurs in which a desired selectivity can be achieved for regions corresponding to flat portions of the silicon nitride film (lower insulating film 6), but a desired etch selectively cannot be achieved for regions corresponding to corners of the silicon nitride film.

To make a self-alignment effect effective when forming the SCs 11, even if the corners of the lower insulating film 6 is exposed to etching gas, the silicon oxide film must be etched at a high selectivity. Thus, regarding with the formation of the SCs 11, because of the large aspect ratio thereof, it is difficult to make a self-alignment effect effective even if an etching process capable of selectively etching the silicon oxide film and the silicon nitride film is employed. Accordingly, the conventional manufacturing method forms the SCs 11 by anisotropic etching capable of removing both the silicon oxide film and the silicon nitride film to simplify the manufacturing processes.

Conditions for the anisotropic etching to form the SCs 11 must be determined so as to be suitable for etching portions of the layer insulating films 6, 7 and 10 having a maximum thickness to avoid forming faulty openings. Since the respective thicknesses of the layer insulating films 6, 7 and 10 are irregular, portions of the silicon substrate 1 exposed to the SCs 11 and corresponding to thin portions of the layer insulating films 6, 7 and 10 may be etched excessively in some cases as shown in FIG. 10. Similarly, in some cases, portions of the silicon substrate 1 exposed in the SCs 11 may be removed excessively by etching for forming the side walls 13. Such damage to the silicon substrate 1 will increase leakage current at PN junctions, which affects adversely to the refreshing characteristic, i.e., basic characteristic, of the DRAM.

The conventional method forms the side walls 13 (silicon nitride films) after forming the SCs 11 so as to open to the source/drain regions 5. Therefore, lower end portions of the side walls 13 are in contact with damaged portions of the source/drain regions 5 damaged when the SCs 11 are formed. When the silicon nitride films are in direct contact with the damaged portions of the source/drain regions 5, electrons are liable to be trapped by the silicon nitride films when the DRAM operates. Therefore, in the conventional DRAM, the damage done to the substrate during the formation of the SCs 11 may affects adversely to the characteristics of the transistors.

Figure 11:
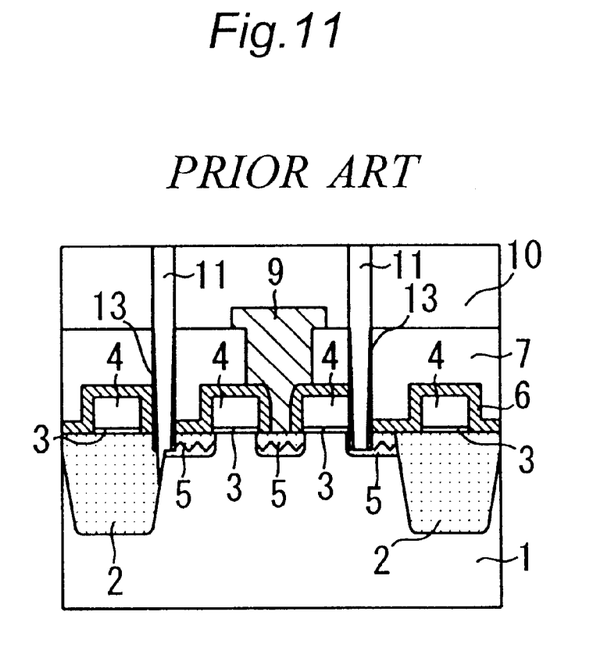

FIG. 11 is a sectional view of a structure formed when a photolithography process for forming the SCs 11 is inaccurate. In the structure shown in FIG. 11, a pattern is formed by photolithography process so that the SCs 11 are formed at positions corresponding to the corners of the lower insulating film 6.

When forming the DRAM by the conventional method, it sometimes occurs that the isolation silicon oxide film 2 is etched by a depth greater than that of the bottom surfaces of the source/drain regions 5 as shown in FIG. 11 when the SCs 11 are formed at the foregoing positions. In the SCs 11 are formed storage node electrodes of doped polysilicon so as to be connected to the capacitors. If the isolation silicon oxide film 2 is etched excessively, the storage node electrodes of doped polysilicon are in contact with the silicon substrate 1 at a depth greater than that of the source/drain regions 5. Consequently, the impurity diffuses from the storage node electrodes of doped polysilicon into the silicon substrate 1 and cells cannot satisfactorily be isolated by the isolation silicon oxide film 2.

SUMMARY OF THE INVENTION

The present invention has been made to solve the foregoing problems and it is therefore a first object of the present invention to provide a semiconductor device having stable refreshing characteristic and transistor operation characteristic, and having isolation silicon oxide film capable of isolating cells with reliability.

A second object of the present invention is to provide a semiconductor device manufacturing method capable of satisfactorily suppressing damaging a silicon substrate when forming a storage node contacts.

The above objects of the present invention are achieved by a semiconductor device of capacitor-over-bit-line construction having capacitors overlying bit lines. The semiconductor device includes a lower insulating film covering source/drain regions electrically connected to the capacitors. An upper insulating film is provided on the lower insulating film. Storage node contacts is provided so as to penetrates the lower insulating film and the upper insulating film, and to reach the source/drain regions. Entire surfaces of the source/drain regions including regions into which the storage node contacts open are substantially flat.

The above objects of the present invention are achieved by a method of manufacturing a semiconductor device of capacitor-over-bit-line construction having capacitors overlying bit lines. In the inventive method, a lower insulating film is formed so as to cover source/drain regions electrically connected to capacitors. An upper insulating film is formed over the lower insulating film. A first anisotropic etching process is performed to form storage node contacts penetrating the lower insulating film and the upper insulating film and reaching the source/drain regions while using the lower insulating film as a stopper film. In the first anisotropic etching, process conditions for selectively etching the upper insulating film at a high selectivity compared with the lower insulating film is employed. A second anisotropic etching process is executed to extend the storage node contacts to the source/drain regions. The second anisotropic etching is performed while using process conditions suitable for selectively etching the lower insulating film at a high selectivity compared with a silicon film.

Other objects and further features of the present invention will be apparent from the following detailed description when read in conjunction with the accompanying drawings.

BRIEF DESCRIPTION OF THE DRAWINGS

FIGS. 2A to 4C are sectional views for describing a manufacturing method of the semiconductor device shown in FIG. 1;

DESCRIPTION OF THE PREFERRED EMBODIMENTS

Preferred embodiments of the present invention will be described with reference to the accompanying drawings, in which like parts are designated by the same reference characters and duplicate description thereof will be omitted.

First Embodiment

Figure 1:
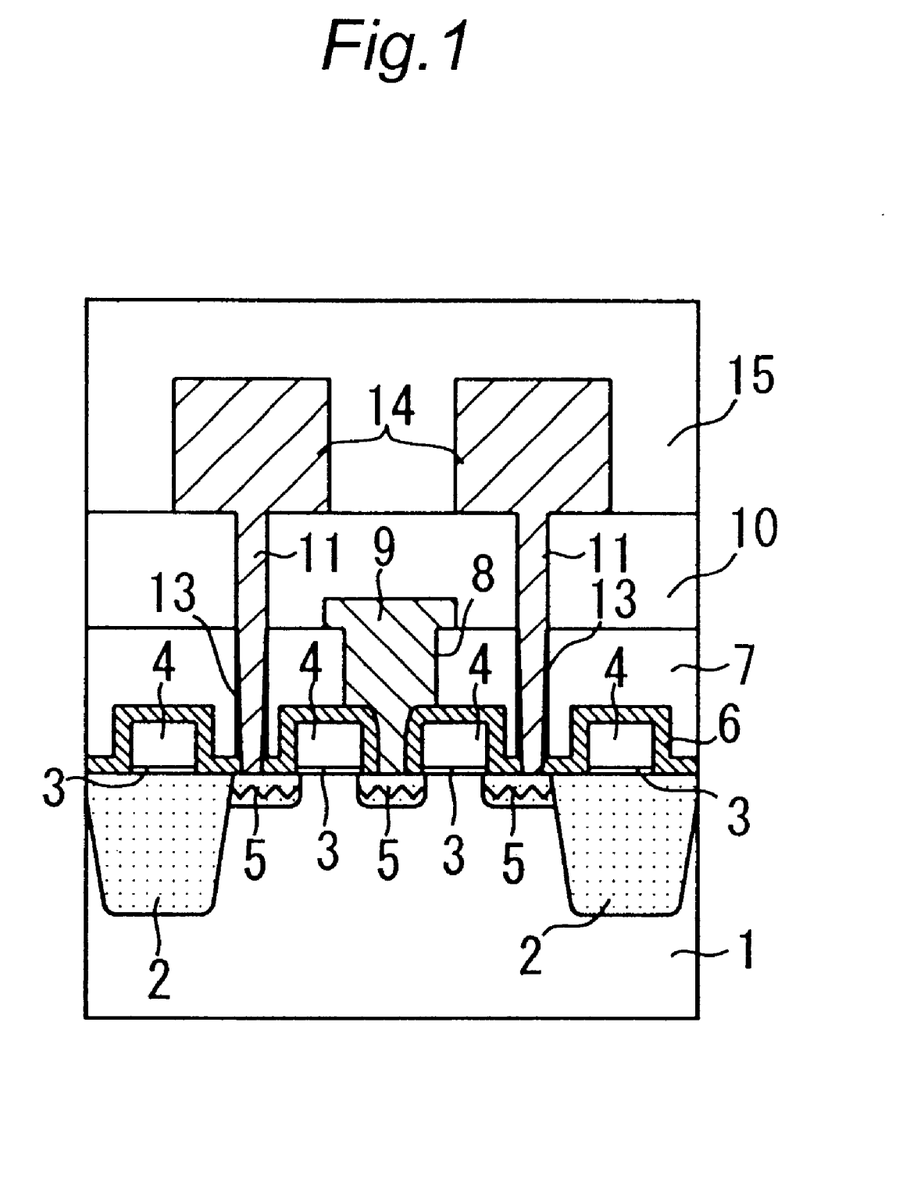
FIG. 1 is a sectional view of a semiconductor device according to a first embodiment of the present invention.

FIG. 1 is a sectional view of a DRAM of COB construction according to a first embodiment of the present invention.

The DRAM has a silicon substrate 1. An isolating silicon oxide film 2 for isolating a plurality of active regions is formed on the silicon substrate 1. Channel regions covered with a gate silicon oxide film 3 and transfer gates (TGs) 4, and source/drain regions 5 adjacent to the channel regions are formed in the active regions.

A lower insulating film 6 of silicon nitride is formed over the silicon substrate 1 and the TGs 4. A first upper insulating film 7 of silicon oxide is formed over the lower insulating film 6. Contact holes 8 opening into the source/drain regions 5 are formed in the first upper insulating film 7 by a known self-alignment process. Bit lines (BLs) 9 are formed on the first upper insulating film 7 so as to be connected through the contact holes 8 to the source/drain regions 5.

A second upper insulating film 10 is formed over the first upper insulating film 7 and the BLs 9. The second upper insulating film 10 is the same in quality as the first upper insulting film 7; that is the second upper insulating film 10 is a silicon oxide film. Storage node contacts (SCs) 11 are formed through the first upper insulating film 7, the second upper insulating film 10 and the lower insulating film 6 so as to open to the source/drain regions 5 on the opposite sides of the source/drain regions 5 connected to the BLs 9.

Side walls 13 are formed so as to cover lower end portions of the side surfaces of the SCs 11. The side walls 13 is a film of the same quality as that of the lower insulating film 6, i.e., a silicon nitride film.

Thick-film capacitors 14 are formed on the second upper insulating film 10. The thick-film capacitors 14 are provided with storage node electrodes formed by depositing doped polysilicon or doped amorphous silicon by a CVD method or the like. The storage node electrodes are electrically connected through the SCs 11 to the source/drain regions 5. The side walls 13 prevent short circuit between the storage node electrodes, and the TGs 4 or the BLs 9.

In the DRAM of the present invention, the surfaces of the each source/drain region 5 is flat including portions thereof exposed in the SCs 11; that is, the SCs 11 are formed so that the source/drain regions 5 are not damaged. Consequently, leakage current from PN junctions near the source/drain regions 5 can satisfactorily be suppressed to ensure a satisfactory, stable refreshing characteristic.

In the DRAM of the present invention, the side walls 13 rise from the surface of the lower insulating film 6 so that the side walls 13 may not be in contact with the source/drain regions 5. Therefore, trapping of electrons flowing through the source/drain regions 5 by the silicon nitride film forming the side walls 13 can surely be prevented, which stabilizes the characteristic of individual transistors.

A method of manufacturing the DRAM shown in FIG. 1 will be described hereinafter with reference to FIGS. 2A to 3D.

Figure 2A:
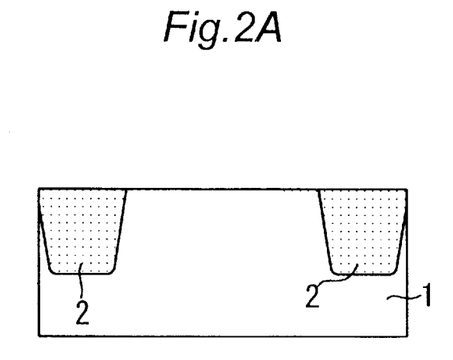

In the manufacturing method of the first embodiment, the isolation silicon oxide film 2 is formed on the silicon substrate 1 first. The isolation silicon oxide film 2 is formed by etching regions for element isolation of the silicon substrate 1 and depositing a silicon oxide film in the etched regions or by a LOCOS method using thermal oxidation. After the isolation silicon oxide film 2 has been formed, an impurity is implanted in the silicon substrate 1 to a desired impurity concentration by ion implantation or thermal diffusion (FIG. 2A).

Figure 2B:
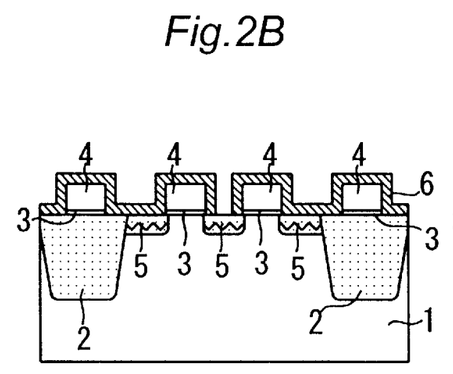

A silicon oxide film is formed on the surface of the silicon substrate 1, and a silicon film or a polycide film is deposited over the silicon oxide film by a CVD method. The layered two films are patterned by a photolithography process and an anisotropic etching process for forming the gate silicon oxide film 3 and the TGs 4. An impurity is implanted in the silicon substrate 1 by ion implantation or thermal diffusion to form the source/drain regions 5. The lower insulating film 6 of silicon nitride is formed so as to cover the surface of the silicon substrate 1 and the TGs 4 entirely. (FIG. 2B).

Figure 2C:
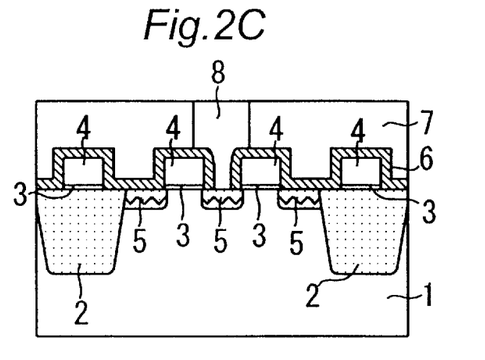

The lower insulating film 6 is formed for functioning as a stopper film when the contact holes 8 is formed for the BLs 9 and the SCs 11 in the first embodiment. Therefore, the lower insulating film 6 may be removed by a photolithography process and an etching process except the portions thereof corresponding to regions for memory cells in which the BLs 9 and the SCs 11 are opened.

a silicon oxide film is deposited so as to cover the surface of the silicon substrate 1 entirely to form the first upper insulating film 7. A photolithography process and an anisotropic etching process are performed so as to form the contact holes 8 which open to the source/drain regions 5 locating at the middle of active regions (FIG. 2C). The etching process for forming the contact holes 8 is started on process conditions capable of removing the silicon oxide film at a high selectivity compared with silicon nitride. The lower insulating film 6 acts as a stopper in this process. Subsequently, anisotropic etching is carried out on process conditions for removing the silicon nitride film at a high selectivity compared with silicon oxide. Consequently, the contact holes 8 self-aligned with and opening to the source/drain regions 5 are formed.

Figure 2D:
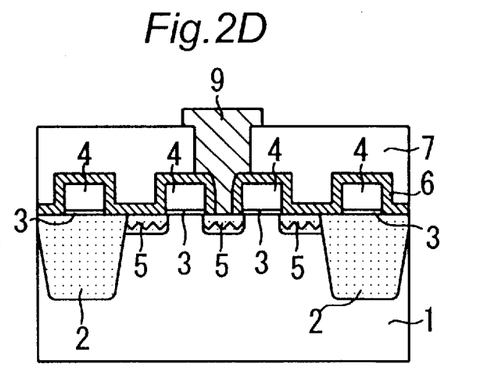

A doped polysilicon film, a polycide film or a metal film is formed so as to fill up the contact holes 8 and to cover the surface of the first upper insulating film 7 entirely. The film formed over the first upper insulating film 7 is patterned by a photolithography process and an etching process to form the BLs 9 (FIG. 2D).

Figure 3A:
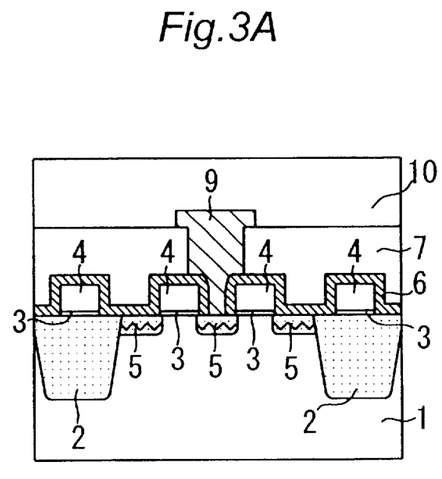

The second upper insulating film 10 equal in quality to the first upper insulating film 7 is formed over the first upper insulating film 7 and the BLs 9 (FIG. 3A).

Figure 3B:
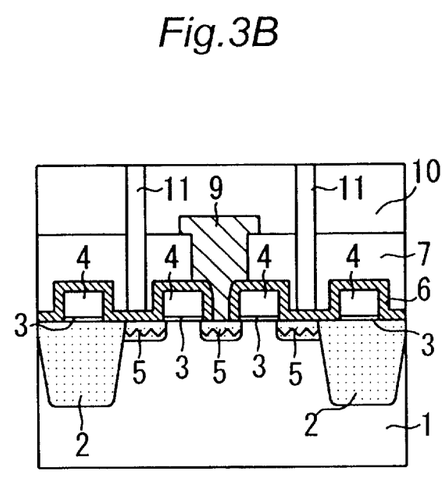

A photolithography process and an anisotropic etching process are performed to form the SCs 11 which extend until the lower insulating film 6 (FIG. 3B). In the above etching process, conditions for etching the silicon oxide film at a high selectivity compared with silicon nitride is employed. During this anisotropic etching process, the lower insulating film 6 serves as a stopper film, whereby the anisotropic etching process is terminated upon the exposure of the lower insulating film 6. Consequently, the SCs 11 penetrating the first upper insulating film 7 and the second upper insulating film 10 can be formed without damaging the silicon substrate 1 at all.

Figure 3C:
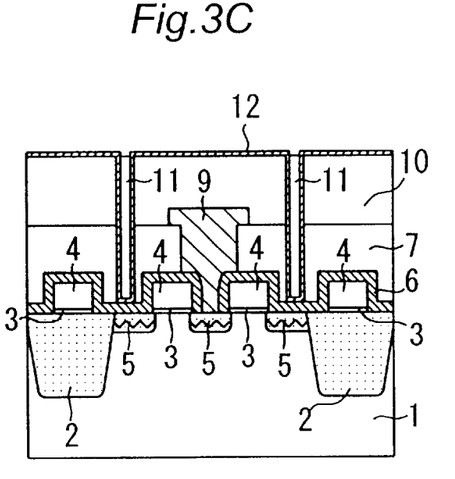

After the SCs 11 extending to the lower insulating film 6 have been formed, an insulating film 12 is formed so as to fill up the SCs 11 and to cover the surface of the second upper insulating film 10 (FIG. 3C). The insulating film 12 is equal in quality to the lower insulating film 6 of silicon nitride.

Figure 3D:
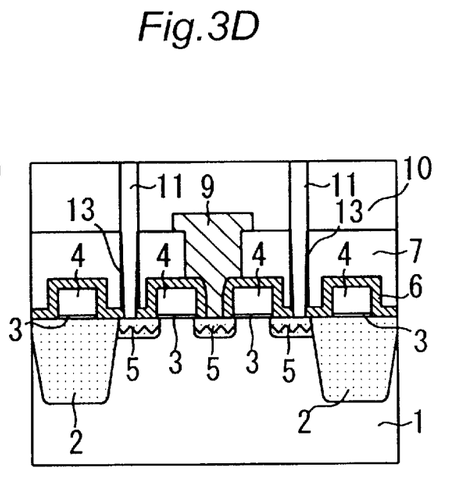

An anisotropic etching process is performed in order to extend the SCs 11 so that the later open to the source/drain regions 5 in the silicon substrate 1. In this process, conditions for etching the insulating film 12 and the lower insulating film 6 at a high selectivity compared with a silicon substrate is employed. Consequently, the SCs 11 are extended to the source/drain regions 5, and the side walls 13 of silicon nitride covering the side surfaces of the lower end portions of the SCs 11 are formed (FIG. 3D).

Subsequently, the manufacture of the DRAM shown in FIG. 1 is completed when the thin-film capacitors 14 and the layer insulating film 15 are formed.

This method is able to suppress satisfactorily the etching of the source/drain regions 5 that is otherwise apt to occurs when the SCs 11 is formed. Therefore, the entire surface of the silicon substrate 1 including areas corresponding to the SCs 11 can be maintained substantially flat and the SCs 11 opening to the source/drain regions 5 can be formed without seriously damaging the silicon substrate 1.

Further, the method is capable of formation of the side walls 13 rising from the lower insulating film 6, because etching the insulating films 6 and 12 after forming the insulating film 12 on the lower insulating film 6. Therefore, the contact of the side walls 13 of silicon nitride with portions of the source/drain regions 5 subject to damaging when the SCs 11 are formed can surely be prevented.

Now, description will be given of the effect of the method of the first embodiment which is yielded when a mask is misaligned in the photolithography process with reference to FIGS. 4A to 4C.

Figure 4A:
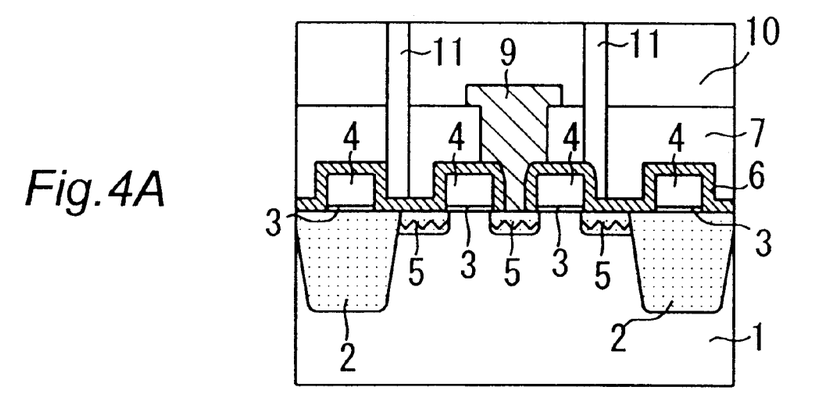

FIG. 4A shows the SCs 11 which is formed under a condition in which transferred patterns of SCs 11 are misaligned with the TGs 4 and the BLs9. In FIG. 4A, the SCs 11 penetrate through the first upper insulating film 7 and the second upper insulating film 10 so as to reach the lower insulating film 6. Since the etching process for forming the SCs 11 is carried out on process conditions suitable for etching the silicon oxide film at a high selectivity, the etching process can surely be terminated upon the exposure of the lower insulating film 6.

Figure 4B:
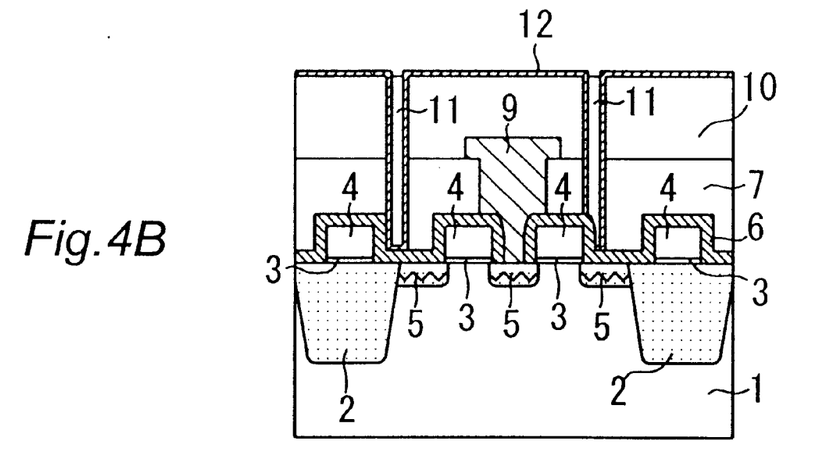
Figure 4C:
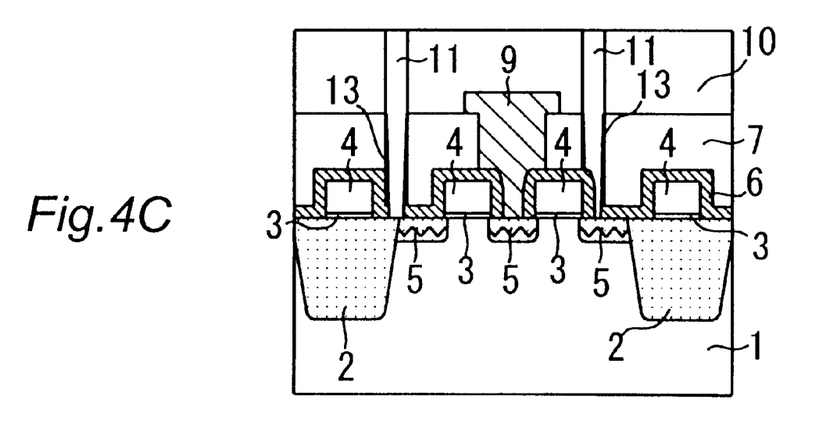

FIG. 4B shows a state in which the insulating film 12 for forming the side walls 13 is deposited in the SCs 11 and on the surface of the second upper insulating film 10. FIG. 4C shows a state in which the SCs 11 have been penetrated and the side walls 13 have been formed by an anisotropic etching process on process conditions suitable for etching the silicon nitride film at a high selectivity compared with silicon oxide.

Subsequently, the thick-film capacitors 14 and the layer insulating film 15 are formed to complete the DRAM shown in FIG. 1. Although the respective thicknesses of the first upper insulating film 7, the second upper insulating film 10 and the lower insulating film 6 formed on the silicon substrate 1 are not uniform, short circuit between the storage node electrodes of the thick-film capacitors 14, and the TGs 4 or the BLs 9 can surely be prevented because of the formation of the side walls 13.

If the etching process for forming the SCs 11 is carried out on process conditions for etching the silicon oxide film and the silicon nitride film at the same etch rate as with the conventional method, there arises a possibility that the SCs 11 extend into the isolation silicon oxide film 2 as shown in FIG. 11, when the mask for forming the SCs 11 is misaligned. In such a state, the storage node electrodes (doped polysilicon) of the thick-film capacitors 14 may come into contact with the silicon substrate 1 at a depth greater than that of the source/drain regions 5.

The impurity concentration of the storage node electrodes of the thick-film capacitors 14 is on the order of $1 \times 10^{20}$ atoms/cm$^3$. The impurity concentration of the silicon substrate 1 is in the range of about $1 \times 10^{16}$ to about $1 \times 10^{17}$ atoms/cm$^3$. Therefore, the impurity contained in the storage node electrodes of the thick-film capacitors 14 diffuses into the silicon substrate owing to the impurity concentration gradient between the storage node electrodes of the thick-film capacitors 14 and the silicon substrate 1. Such diffusion of the impurity from the storage node electrodes of the thick-film capacitors 14 into the silicon substrate 1 increases the impurity concentration of the silicon substrate 1 excessively and the isolation silicon oxide film 2 is unable to achieve satisfactory isolation between the elements.

Since the method of the present invention carries out the anisotropic etching for forming the SCs 11 on process conditions for etching the silicon oxide film at a high selectivity, the anisotropic etching process can surely be terminated upon the exposure of the lower insulating film 6. Accordingly, the extension of the SCs 11 into the isolation silicon oxide film 2 can surely be prevented and hence isolation between the elements can satisfactorily be achieved.

Second Embodiment

Figure 5:
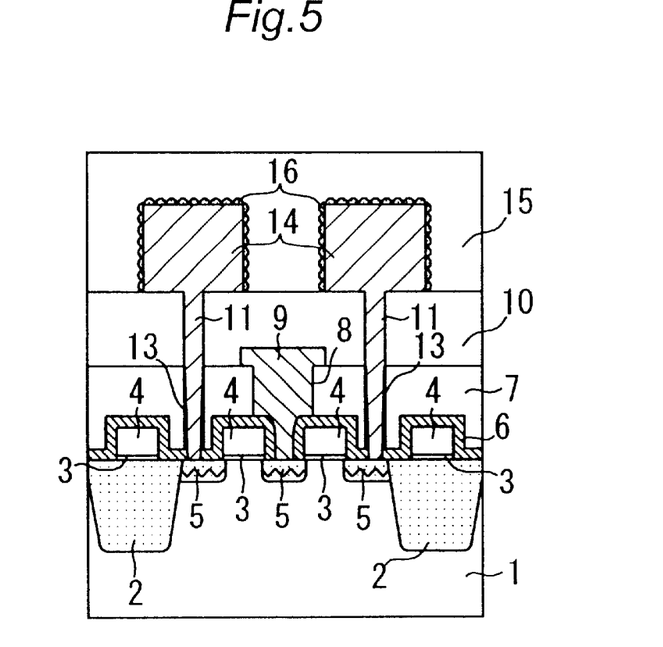
FIG. 5 is a sectional view of a semiconductor device according to a second embodiment of the present invention.

FIG. 5 is a sectional view of a DRAM according to a second embodiment of the present invention. In the DRAM of the second embodiment, the storage node electrodes of thick-film capacitors 14 are coated with granular crystals 16. The granular crystals 16 increases the surface area of the storage node electrodes and thereby the capacity of the thick-film capacitors 14 can be increased.

Third Embodiment

Figure 6:
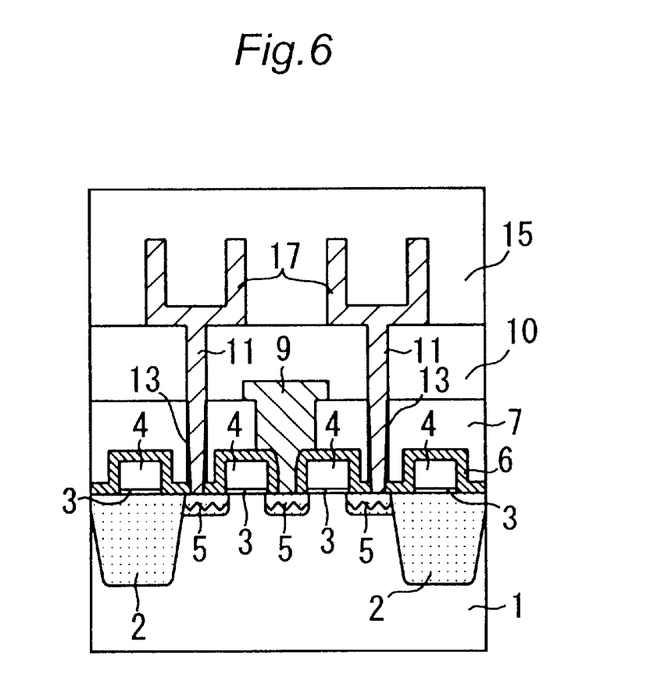
FIG. 6 is a sectional view of a semiconductor device according to a third embodiment of the present invention.

FIG. 6 is a sectional view of a DRAM according to a third embodiment of the present invention. The DRAM of the third embodiment is provided with cylindrical capacitors 17 provided with cylindrical storage nodes, respectively. The cylindrical storage node electrodes have a surface area greater than that of thick-film storage node electrodes. Accordingly, the memory cells of the DRAM in the third embodiment have a large capacity.

Fourth Embodiment

Figure 7:
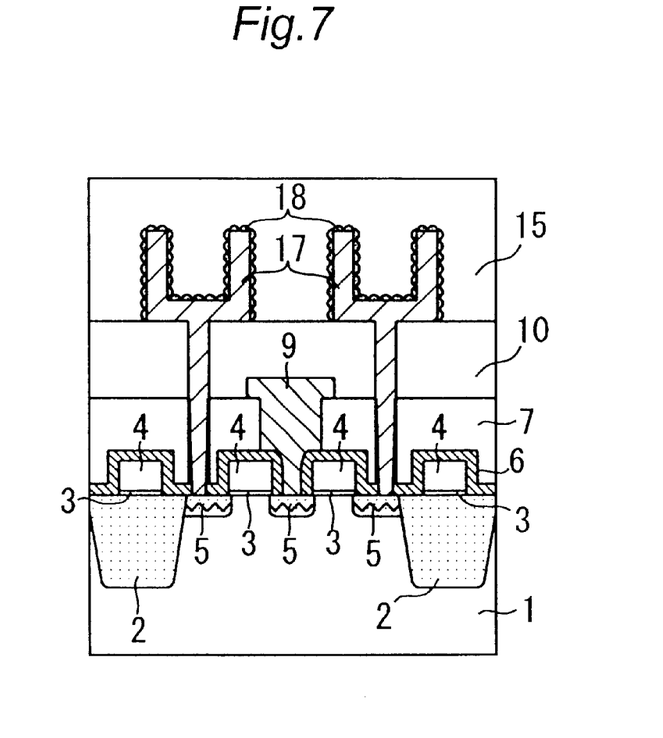
FIG. 7 is a sectional view of a semiconductor device according to a fourth embodiment of the present invention.

FIG. 7 is a sectional view of a DRAM according to a fourth embodiment of the present invention. The DRAM of the fourth embodiment is provided with cylindrical capacitors 17 provided with cylindrical storage nodes coated with granular crystals 18, respectively. The granular crystals 18 increases the surface area of the storage node electrodes. Accordingly, the cylindrical capacitors 17 have a large capacity.

Fifth Embodiment

Figure 8:
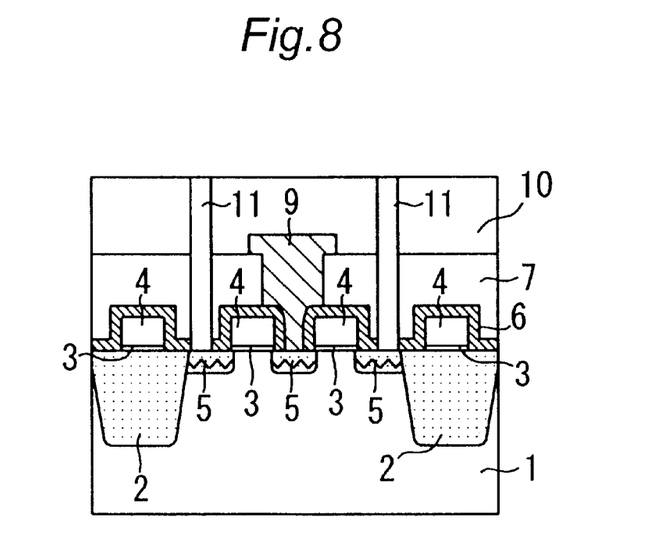
FIG. 8 is a sectional view of a semiconductor device according to a fifth embodiment of the present invention.

FIG. 8 is a sectional view of a DRAM according to a fifth embodiment of the present invention. The DRAM of the fifth embodiment is the same in construction as the DRAM in the first embodiment, except that the DRAM in the fifth embodiment is not provided with any films corresponding to the side walls 13. A method of manufacturing the DRAM in the fifth embodiment is the same as that of manufacturing the DRAM in the first embodiment, except that the former does not include any process for forming the side walls 13.

The DRAM in the fifth embodiment and the method of manufacturing the same are effective in preventing short circuit between the storage node electrodes of the capacitors, and the TGs 4 or BLs 9 without using the side walls 13. The DRAM in the fifth embodiment, similarly to the DRAM in the first embodiment, has an excellent refreshing characteristic and stabilizes the operating characteristic of the individual transistors.

The major benefits of the present invention described above are summarized as follows:

The semiconductor device according to the first aspect of the present invention has the source/drain regions which are scarcely etched by the process for forming the storage node contacts. Those source/drain regions are capable of satisfactorily suppressing leakage currents from the PN junctions. Accordingly, a satisfactory refreshing characteristic can be realized.

The semiconductor device according to the second aspect of the present invention has the upper insulating film of silicon oxide and the lower insulating film of silicon nitride. Damage to the source/drain regions can satisfactorily be suppressed and the storage nodes opening to the source/drain regions can easily be formed by making good use of the difference in etch rate between those insulating films.

According to the third aspect of the present invention, short circuit between the storage node electrodes of the capacitors formed in the storage node contacts, and the bit lines or the transfer gates can surely be prevented because the lower end portions of the storage node contacts are covered with the side walls. Since the side walls rise from the lower insulating film and are not in contact with damaged portions of the source/drain regions, the operating characteristic of the individual transistors can be stabilized.

According to the fourth aspect of the present invention, the entire surfaces of portions of the source/drain regions subject to damaging when the storage node contacts are formed are in contact with storage node electrodes connected to the capacitors and are not in contact with the silicon nitride film. Accordingly, trapping of electrons by the silicon nitride film can surely be prevented and a stable operating characteristic can be realized.

According to the fifth aspect of the present invention, the first anisotropic etching process uses the lower insulating film as a stopper film, so that the storage node contacts extending through the upper insulating film can be formed without damaging the silicon substrate. The storage node contacts can be extended to the source/drain regions, satisfactorily suppressing damaging the silicon substrate by the second anisotropic etching process. Accordingly, the semiconductor device of the present invention has an excellent refreshing characteristic.

According to the sixth aspect of the present invention, the storage node contacts opening to the source/drain regions can easily be formed, satisfactorily suppressing damaging the source/drain regions by making good use of the difference in etch rate between the silicon oxide film and the silicon nitride film.

According to the seventh aspect of the present invention, after the storage node contacts reaching the lower insulating film has been formed, the insulating film covering the side surfaces of the storage node contacts is formed. Then, the storage node contacts are opened to the source/drain regions by simultaneously removing portions of the insulating film and the lower insulating film by the second anisotropic etching process. Thus, the side walls are formed so as to cover the lower end portions of the side surfaces of the storage node contacts and to rise from the lower insulating film. Accordingly, the present invention enables to manufacture the semiconductor device in which short circuit between the storage node electrodes of the capacitors, and the transfer gates or the bit lines are prevented unfailingly and the individual transistors show a stable operating characteristic.

According to the eighth aspect of the present invention, the storage node electrodes for the capacitors are formed so that the damaged portions of the source/drain regions may not be in contact with the silicon nitride film. Accordingly, the semiconductor device of the present invention has the individual transistors having a stable operating characteristic.

Further, the present invention is not limited to these embodiments, but variations and modifications may be made without departing from the scope of the present invention.

The entire disclosure of Japanese Patent Application No. Hei 11-211357 filed on Jul. 26, 1999 including specification, claims, drawings and summary are incorporated herein by reference in its entirety.

What is claimed is:

1. A semiconductor device of capacitor-over-bit-line construction having capacitors overlying bit lines, the semiconductor device comprising:

a lower insulating film covering source/drain regions electrically connected to the capacitors;

an upper insulating film overlying the lower insulating film; and storage node contacts penetrating the lower insulating film and the upper insulating film, and reaching the source/drain regions;

wherein entire surfaces of the source/drain regions including regions into which the storage node contacts open are substantially flat; and at least lower end portions of the storage node contacts are covered with side walls, the side walls being formed of a film equal in quality to the lower insulating film and rising from the lower insulating film.

2. The semiconductor device according to claim 1, wherein the upper insulating film is a silicon oxide film and the lower insulating film is a silicon nitride film.

3. The semiconductor device according to claim 1, wherein entire surfaces of portions of the source/drain regions exposed to the storage node contacts are in contact with storage node electrodes connected to the capacitors.

* * * * *